(12) United States Patent
Gu et al.

(10) Patent No.: US 8,797,119 B2
(45) Date of Patent: Aug. 5, 2014

(54) TUNING METHODS FOR TUNABLE MATCHING NETWORKS

(75) Inventors: Qizheng Gu, San Diego, CA (US); Javier Rodriguez De Luis, Kirkland, WA (US)

(73) Assignee: Wispry, Inc., Irvine, CA (US)

( * ) Notice: Subject to any disclaimer, the term of this patent is extended or adjusted under 35 U.S.C. 154(b) by 334 days.

(21) Appl. No.: 13/212,856

(22) Filed: Aug. 18, 2011

(65) Prior Publication Data

US 2012/0119842 A1 May 17, 2012

Related U.S. Application Data

(60) Provisional application No. 61/401,727, filed on Aug. 18, 2010.

(51) Int. Cl.
*H03H 7/38* (2006.01)

(52) U.S. Cl.
USPC .......................................................... 333/32

(58) Field of Classification Search
USPC .......................................................... 333/32
See application file for complete search history.

(56) References Cited

U.S. PATENT DOCUMENTS

| | | | |
|---|---|---|---|
| 6,208,945 | B1 | 3/2001 | Koda et al. |
| 6,946,847 | B2 | 9/2005 | Nishimori |
| 2007/0070737 | A1 | 3/2007 | Fischer |
| 2009/0206962 | A1 | 8/2009 | Chou et al. |
| 2010/0073103 | A1 | 3/2010 | Spears et al. |
| 2010/0156552 | A1 | 6/2010 | Mckinzie, III et al. |
| 2011/0175687 | A1* | 7/2011 | Morris, III .................. 333/32 |
| 2012/0293187 | A1 | 11/2012 | Morris, III |

FOREIGN PATENT DOCUMENTS

| | | |
|---|---|---|
| EP | 2 606 573 | 6/2013 |
| EP | 2 689 257 | 1/2014 |
| JP | 2004-062407 | 2/2004 |
| KR | 10-2006-0039777 | 5/2006 |
| WO | WO 2012-024517 | 2/2012 |
| WO | WO 2012/129348 | 9/2012 |

OTHER PUBLICATIONS

International Search Report and Written Opinion for PCT/US2011/048295 dated Dec. 27, 2011.

J. De Mingo et al., "An RF electronically controlled impedance tuning network design and its application to an antenna input impedance automatic matching system," Microwave Theory and Techniques, IEEE Transactions, 2004 pp. 489-497 vol. 52.

(Continued)

*Primary Examiner* — Stephen Jones
(74) *Attorney, Agent, or Firm* — Jenkins, Wilson, Taylor & Hunt, P.A.

(57) ABSTRACT

Methods for tuning a tunable matching network can involve comparing a source impedance of a source to a real part of a load impedance of a load. Depending on characteristics of the network, capacitances of one or more tunable capacitors can be set to correspond to device boundary parameters, and capacitances of remaining tunable capacitors can be set based on a predetermined relationship between the parameters of the capacitors, the source, the load, and other components. From these initially determined values, the capacitance value of one or more of the capacitors can be adjusted to fall within device boundary conditions and achieve a perfect or at least best match tuning configuration.

10 Claims, 11 Drawing Sheets

(56) References Cited

OTHER PUBLICATIONS

P. Sjoblom et al., "An adaptive impedance tuning CMOS circuit for ISM 2.4-GHz band," Circuits and Systems I: Regular Papers, IEEE Transactions, 2005, pp. 1115-1124, vol. 52.

H. Song et al., "Automatic antenna tuning unit for software-defined and cognitive radio," Antennas and Propagation Society International Symposium, 2007 IEEE, 2007, pp. 85-88.

K. Brito De Brito et al., "Impedance Network for an Automatic Impedance Matching System," Microwave Conference, APMC, Asia-Pacific, 2007, pp. 1-4.

J.S Fu et al., "A ferroelectric-based impedance tuner for adaptive matching applications," Microwave Symposium Digest, IEEE MTT-S International, 2008, pp. 955-958.

A Van Bezooijen et al., "Adaptive Impedance-Matching Techniques for Controlling L Networks," Circuits and Systems I: Regular Papers, IEEE Transactions, 2010, pp. 495-505, vol. 57.

International Search Report and Written Opinion for Application No. PCT/US2012/030011 dated Oct. 23, 2012.

Notice of Publication for PCT/US/2011/048295 dated Feb. 23, 2012.

* cited by examiner

TUNING METHODS FOR TUNABLE MATCHING NETWORKS

RELATED APPLICATIONS

The presently disclosed subject matter claims the benefit of U.S. Provisional Patent Application Ser. No. 61/401,727, filed Aug. 18, 2010, the disclosure of which is incorporated herein by reference in its entirety.

TECHNICAL FIELD

The subject matter disclosed herein relates generally to methods for operating electronic devices. More particularly, the subject matter disclosed herein relates to methods for tuning a tunable matching network.

BACKGROUND

Matching networks that utilize tunable components can be useful for matching variable loads and/or optimizing performance at multiple frequencies. It has been recognized, however, that tuning a network containing multiple tunable components is not an easy job without using a simulation optimizer. Even then, the match tuning of using such an optimizer can be a slow process. For example, matching 300 load impedances might take a couple of hours using currently available commercial optimizers. Furthermore, the optimizer might not be able to achieve optimum results because of the tendency of iterative values to become trapped in local minimum or maximum values.

As a result, it would be desirable for a tuning algorithm for such a tunable matching network to not only perform much faster the simulation optimizers, but also to provide a deterministic and unique solution.

SUMMARY

In accordance with this disclosure, novel methods for tuning a tunable matching network are provided. In one aspect, a method for tuning a tunable matching network can comprise a first variable capacitor comprising a terminal connected to a first node, a second variable capacitor comprising a terminal connected to a second node, and a first inductor and a third variable capacitor connected in parallel between the first and second nodes is provided. The method can comprise comparing a source impedance of a source connected to the first node to a real part of a load impedance of a load connected to the second node. When the source impedance is greater than the real part of the load impedance or when a calculated capacitance of the second variable capacitor is less than a minimum capacitance, a capacitance value of the second variable capacitor can be set to be a minimum capacitance of the second variable capacitor, and a capacitance value of the first variable capacitor can be determined based on a predetermined relationship between the capacitance of the first variable capacitor, a conductance of the source, and an equivalent conductance of the first inductor and the third variable capacitor. Alternatively, when the source impedance is less than the real part of the load impedance or when a calculated capacitance of the first variable capacitor is less than a minimum capacitance, a capacitance value of the first variable capacitor can be set to be a minimum capacitance of the first variable capacitor, and a capacitance value of the second variable capacitor can be determined based on a predetermined relationship between the capacitance of the second variable capacitor, a minimum susceptance of the first variable capacitor, an impedance of the source, a conductance of the load, and a susceptance of the load.

Either way, the method can further comprise determining a capacitive value of the third variable capacitor based on a predetermined relationship between the capacitance of the third variable capacitor, an inductance of the first inductor, and an equivalent series inductance of the first inductor and the third variable capacitor, adjusting the capacitance value of one or more of the first variable capacitor, second variable capacitor, or third variable capacitor if the capacitance value is less than a minimum capacitance or greater than a maximum capacitance for the first variable capacitor, second variable capacitor, or third variable capacitor, respectively, and setting the capacitances of the first variable capacitor, the second variable capacitor, and the third variable capacitor to be equal to the respective capacitance values.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides methods for tuning a tunable matching network. It is believed that the tuning methods disclosed herein can do the same job with similar accuracy as a simulation optimizer, but the speed of these methods can be more than 1000 times faster than the speed of the optimizer.

Single Pi Network Configuration

Figure 1A:
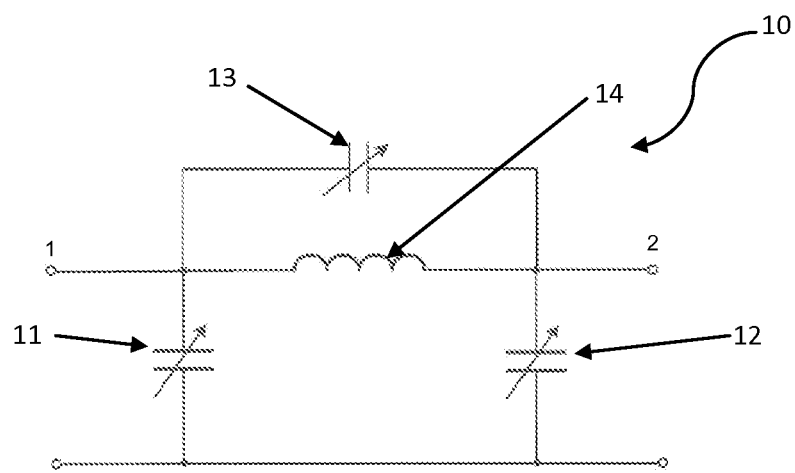
FIG. 1a is a circuit arrangement for a tunable single section Pi matching network.
Figure 1B:
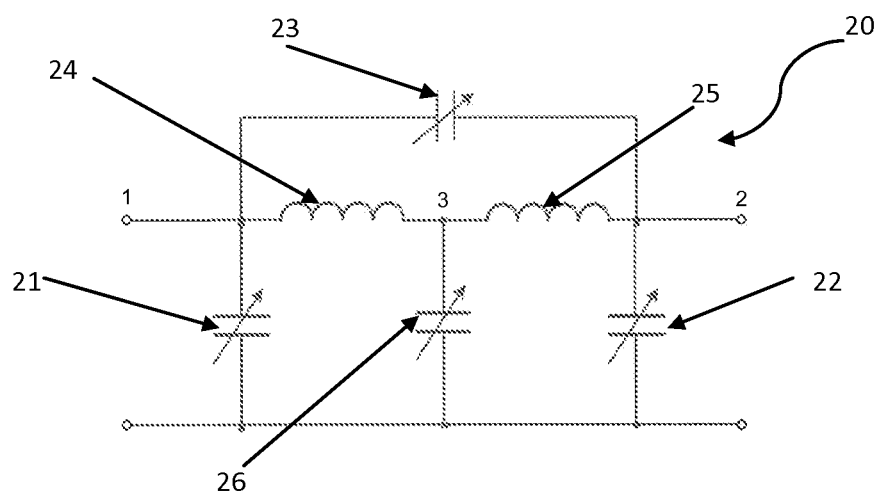
FIG. 1b is a circuit arrangement for a tunable capacitor-bridged double Pi matching network.

In one aspect, for example, methods according to the present subject matter can be applied to a tunable Pi network having a configuration shown in FIG. 1a. A tunable Pi network, generally designated 10, can theoretically make all load impedances over the entire Smith chart getting conjugation match if the three tunable components in Pi network 10 can be tuned to any desired value. Pi network 10 is one of the simplest topologies, which is capable of perfectly matching the load impedances over the entire Smith chart. Of course, it should be understood, however, that the principles applied to the tuning of tunable Pi network 10 can be extended to methods of tuning other network configurations. For example, FIG. 1b shows a capacitor-bridged double Pi network, generally designated 20, which is also sometimes referred to as a bypassed lumped-TL.

In Pi network 10 shown in FIG. 1a, a first tunable MEMS capacitor, generally designated 11, having a first capacitance $C_1$ is connected to a first node 1, a second tunable MEMS capacitor, generally designated 12, having a second capacitance $C_2$ is connected to a second node 2, and a third tunable MEMS capacitor, generally designated 13, having a third capacitance $C_3$ and a first inductor, generally designated 14, having a first inductance $L_1$ are connected in parallel between first node 1 and second node 2. Using these three tunable MEMS capacitors 11, 12, and 13, the capacitances $C_1$, $C_2$, and $C_3$ thus serve as three variables for the system. To solve for an optimum configuration of the capacitances, two equations can be derived from the condition of impedance conjugation match: one from the real part and another one from imaginary part of the impedance match equation. In order to solve these two equations having three variables, a value can be assigned to one of the three capacitances.

Figure 2:
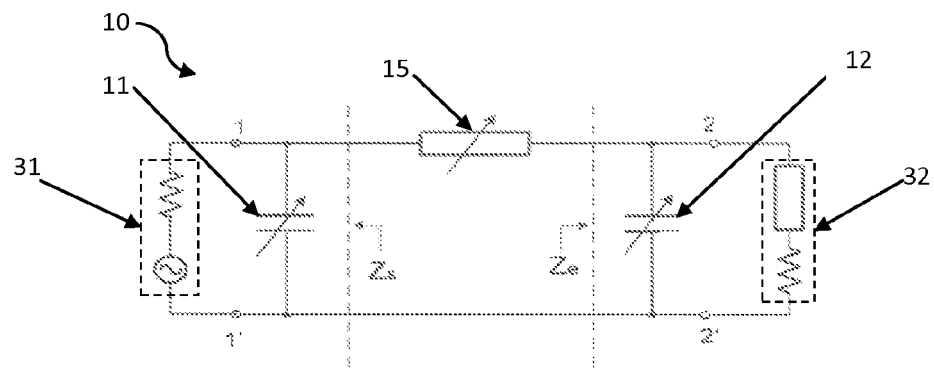
FIG. 2 is a circuit arrangement for a tunable single section Pi matching network connected to a source and a load.

Referring to FIG. 2, Pi network 10 can comprise a source, generally designated 31, having a source impedance Ro connected to first node 1 and a load, generally designated 32, connected to second node 2, load 32 having a load resistance $R_L$ and a load inductance $X_L$, with the combination of these elements defining a load impedance $Z_L$ having the relationship $Z_L = R_L + j X_L$. The combination of third tunable MEMS capacitor 13 and first inductor 14 can be modeled as a single equivalent element, generally designated 15, having an equivalent series resistance $R_e$ and an equivalent series inductance $L_e$.

In the case of load resistance $R_L$ being less than or equal to source impedance $R_o$, the second capacitance $C_2$ can be set to a minimum second capacitance $C_{2,min}$, and a second inductance $B_{C2}$ of the second capacitor can be set to a value equal to $\omega C_{2,min}$. Based on these settings, solutions for the values of first capacitance $C_1$ and second capacitance $C_3$ can be determined as follows:

$$C_1 = \frac{1}{2\pi f} \sqrt{G_o(G_e - G_o)} \quad (1)$$

$$C_3 = \frac{L_e - L}{\omega^2 L_e L} \quad (2)$$

and $$L_e = \frac{1}{2\pi f}\left(\sqrt{R_e(R_o - R_e)} - X_e\right) \quad (3)$$

where an equivalent series conductance $G_e$ is equal to the inverse of equivalent series resistance $R_e$, and $$R_e = \frac{G_L}{G_L^2 + (B_L + B_{C2,min})^2} \text{ and } X_e = \frac{-(B_L + B_{C2,min})}{G_L^2 + (B_L + B_{C2,min})^2} \quad (4)$$

$$Y_L = \frac{1}{Z_L} = G_L + jB_L = \frac{R_L}{R_L^2 + X_L^2} - j\frac{X_L}{R_L^2 + X_L^2} \quad (5)$$

Alternatively, in the case of load resistance $R_L$ being greater than source impedance $R_o$, first capacitance $C_1$ can be set to a minimum first capacitance $C_{1,min}$, and a first susceptance $B_{C1}$ of first capacitor 11 can be set to a value equal to $\omega C_{1,min}$. Using these parameters, solutions for the values of first capacitance $C_1$ and second capacitance $C_3$ can be determined as follows:

$$C_2 = \frac{1}{2\pi f}\left(\sqrt{\frac{G_L}{R_o}(1 + R_o^2 B_{C1,min}^2) - G_L^2} - B_L\right) \quad (6)$$

$$C_3 = \frac{L_e - L}{\omega^2 L_e L} \quad (7)$$

and $$L_e = \frac{1}{2\pi f}\left(\frac{\sqrt{\frac{G_L}{R_o}(1 + R_o^2 B_{C1,min}^2) - G_L^2}}{\frac{G_L}{R_o}(1 + R_o^2 B_{C1,min}^2)} + \frac{R_o^2 B_{C1,min}}{1 + R_o^2 B_{C1,min}^2}\right) \quad (8)$$

A perfect conjugation match is realized if first capacitance $C_1$ and third capacitance $C_3$ resulting from Equations (1) and (2) or second capacitance $C_2$ and third capacitance $C_3$ obtained from Equations (6) and (7) are within their boundary values (i.e., $C_{k,min} \leq C_k \leq C_{k,max}$ for k=1, 2, or 3). Otherwise, further calculations can be performed for the best match solutions based on maximizing Transducer Gain (TG)/Relative Transducer Gain (RTG) and/or minimizing voltage standing wave ratio (VSWR).

In the case of first capacitance $C_1$ having a value equal to a maximum first capacitance $C_{1,max}$ of first capacitor 11 and second capacitance $C_2$ being equal to minimum second capacitance $C_{2,min}$ of second capacitor 12, or in the case of first capacitance $C_1$ being equal to minimum first capacitance $C_{1,min}$ of first capacitor 11 and second capacitance $C_2$ being equal to a maximum second capacitance $C_{2,max}$ of second capacitor 12, equivalent series inductance $L_e$ providing the best match resulting from $\partial VSWR_{in}/\partial L_e = 0$ can be determined by the following relationship:

$$L_e = \frac{1}{2\pi f} \cdot \frac{B_{C2x} + B_L + B_{C1x}R_o^2[(B_{C2x} + B_{C2x} + B_L)(B_{C2x} + B_L) + G_L^2]}{[(B_{C2x} + B_L)^2 + G_L^2] \cdot (B_{C1x}^2 R_o^2 + 1)} \quad (9)$$

where $$B_{Ckx} = \omega \cdot C_{k,min} \text{ or } C_{k,max} \text{ for } k = 1 \text{ or } 2$$

In circumstances where third capacitance $C_3$ is calculated to be less than a minimum third capacitance $C_{3,min}$ of third capacitor 13 or greater than a maximum third capacitance $C_{3,max}$ of third capacitor 13, third capacitance can be set to be equal to minimum third capacitance $C_{3,max}$ or maximum third capacitance $C_{3,max}$, respectively. If the value of second capacitance $C_2$ has already been assigned to either minimum second capacitance $C_{2,min}$ or maximum second capacitance $C_{2,max}$, the value of first capacitance $C_1$ can be chosen to minimize the input VSWR of the Pi network tuner from $\partial VSWR_{in}/\partial C_1 = 0$ as follows:

$$C_1 = \frac{1}{2\pi f} \cdot \frac{X_{Le}[(B_L + B_{C2x})^2 + G_L^2] - (B_L + B_{C2x})}{[1 - X_{Le}(B_L + B_{C2x})]^2 + X_{Le}^2 G_L^2} \quad (10)$$

where $$X_{Le} = \omega L_e = \frac{\omega L}{1 - \omega^2 LC_{3,min}} \text{ or } \frac{\omega L}{1 - \omega^2 LC_{3,max}}$$

On the other hand, if first capacitance $C_1$ has been defined as equal to minimum first capacitance $C_{1,min}$ or maximum first capacitance $C_{1,max}$, second capacitance $C_2$ can be determined to minimize the input VSWR of the Pi network tuner derived from $\partial VSWR_{in}/\partial C_2 = 0$ as follows:

$$C_2 = \frac{1}{2\pi f} \cdot \frac{X_{Le}[1 - X_{Le}B_L(1 + R_o^2 B_{C1x}^2) + B_{C1x}R_o^2(2B_L + B_{C1x})] - R_o^2(B_L + B_{C1x})}{X_{Le}^2 + R_o^2(1 - X_{Le}B_{C1x})^2} \quad (11)$$

Figure 3:
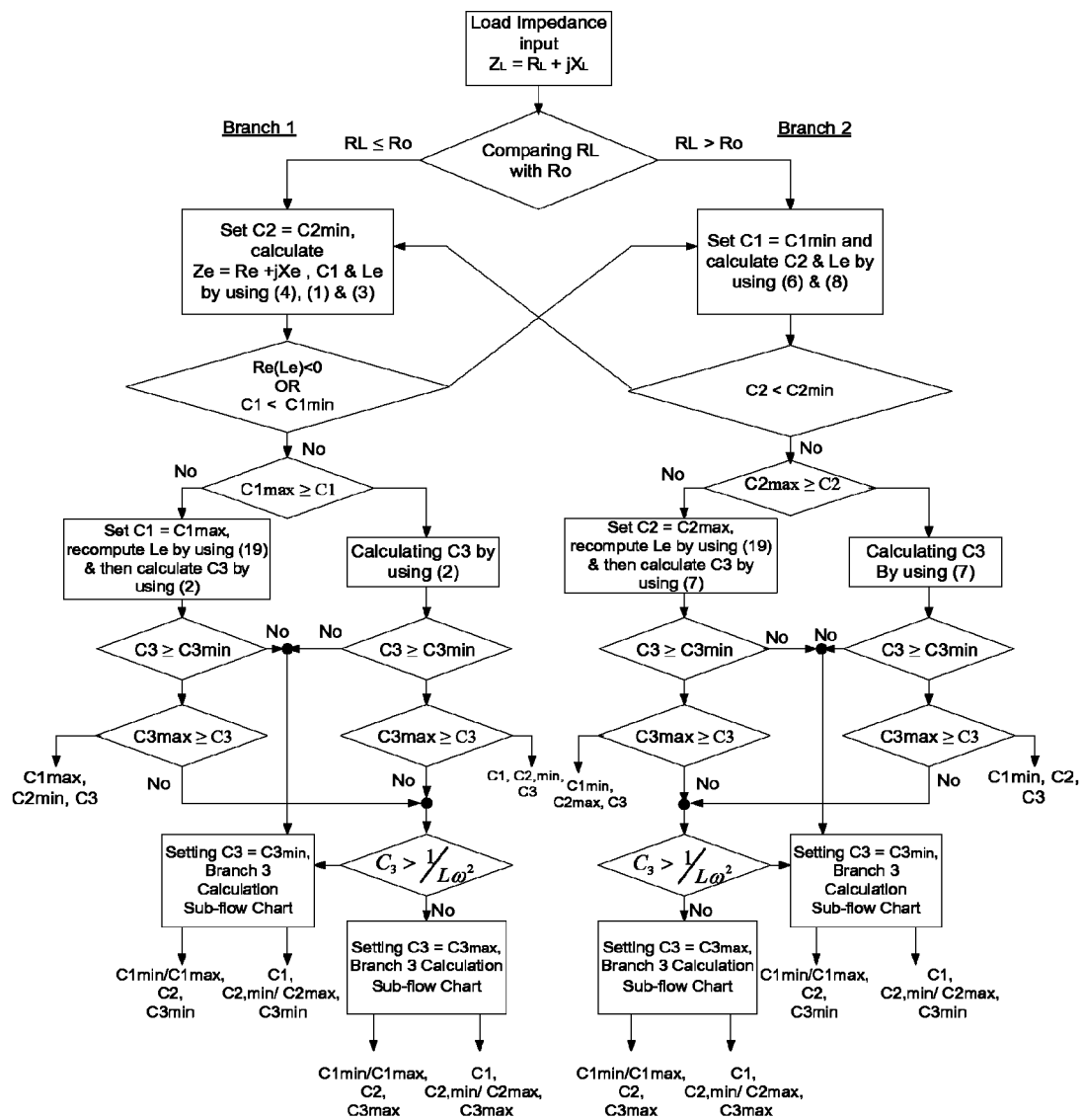
FIG. 3 is a flow chart illustrating a tuning method according to an embodiment of the presently disclosed subject matter.

Based on these relationships, the method for tuning a tunable matching network can follow the steps laid out in the flow chart shown in FIG. 3. Specifically, source impedance $R_o$ can be compared against load resistance $R_L$ (i.e., the real part of load impedance $Z_L$). In cases where source impedance $R_o$ is greater than load resistance $R_L$, or when a calculated value for second capacitance $C_2$ is less than minimum second capacitance $C_{2,min}$, the tuning method can involve the steps outlined in Branch 1 of the flow chart illustrated in FIG. 3. Second capacitance value $C_2$ can be set to be equal to minimum second capacitance $C_{2,min}$, and first capacitance $C_1$ can be determined based on a predetermined relationship between first capacitance $C_1$, source conductance $G_o$, and equivalent series conductance $B_e$. Specifically, using values for load conductance $G_L$ and load susceptance $B_L$ calculated from Equation (5), equivalent load impedance $Z_e$ can be determined using Equation (4), which can in turn be used to determine values for first capacitance $C_1$ and equivalent series inductance $L_e$ using Equations (1) and (3), respectively.

If the real part of equivalent load inductance $L_e$ is less than 0, or if first capacitance $C_1$ is less than minimum first capacitance $C_{1,min}$, then the tuning method can follow the steps outlined below as if source impedance $R_o$ was less than load resistance $R_L$, which is provided in Branch 2 of the flow chart illustrated in FIG. 3. Otherwise, third capacitance $C_3$ can be determined based on the predetermined relationship between third capacitance $C_3$, first inductance $L_1$, and equivalent series inductance $L_e$. Specifically, if first capacitance $C_1$ is less than or equal to maximum first capacitance $C_{1,max}$, third capacitance $C_3$ using the relationship described by Equation (2). If first capacitance $C_1$ is greater than maximum first capacitance $C_{1,max}$, however, first capacitance $C_1$ can be set to be equal to maximum first capacitance $C_{1,max}$, equivalent series inductance $L_e$ can be re-computed using Equation (9), and third capacitance $C_3$ can be determined using Equation (2).

If these steps result in values for first capacitance $C_1$, second capacitance $C_2$, and third capacitance $C_3$ that are within the permissible ranges for each device (i.e., $C_{k,min} \leq C_k \leq C_{k,max}$), then a perfect match is achieved for tuning the system. Otherwise, further tuning steps can be taken to achieve a best possible match. Specifically, if third capacitance $C_3$ is less than minimum third capacitance $C_{3,min}$, third capacitance $C_3$ can be set to be equal to minimum third capacitance $C_{3,min}$, and the steps outlined in the flow chart illustrated in FIG. 4 can be performed. Alternatively, if third capacitance $C_3$ is greater than maximum third capacitance $C_{3,max}$, third capacitance $C_3$ can be set to be equal to maximum third capacitance $C_{3,max}$ if third capacitance $C_3$ is less than or equal to $1/(\omega^2 L)$, or third capacitance $C_3$ can be set to be equal to minimum third capacitance $C_{3,min}$ if third capacitance $C_3$ is less than or equal to $1/(\omega^2 L)$. In either case, the method can further comprise the relevant steps outlined in the flow chart illustrated in FIG. 4, which is discussed hereinbelow.

In cases where source impedance $R_o$ is less than load resistance $R_L$, or the real part of equivalent load inductance $L_e$ is less than 0 or if first capacitance $C_1$ is less than minimum first capacitance $C_{1,min}$ as discussed above, the tuning method can involve the steps outlined in Branch 2 of the flow chart illustrated in FIG. 3. Specifically, first capacitance $C_1$ can be set to be equal to minimum first capacitance $C_{1,min}$, and second capacitance $C_2$ can be determined based on the predetermined relationship between second capacitance $C_2$, a minimum susceptance of the first variable capacitor $B_{C1,min}$, source impedance $R_o$, load conductance $G_L$, and load susceptance $B_L$. In particular, values for second capacitance $C_2$ and equivalent series inductance $L_e$ can be calculated based on the relationships defined by Equations (6) and (8), respectively. If the value for second capacitance $C_2$ is calculated to be less than minimum second capacitance $C_{2,min}$, then the tuning method can be reapplied using the steps outlined in Branch 1 of FIG. 3 and discussed above.

If the value for second capacitance $C_2$ is determined to be less than maximum second capacitance $C_{2,max}$, third capacitance $C_3$ can be calculated using Equation (6) from the value of equivalent series inductance $L_e$ derived from Equation (8). Otherwise, second capacitance $C_2$ can be set to be equal to maximum second capacitance $C_{2,max}$, equivalent series inductance $L_e$ can be recomputed using Equation (9), and third capacitance $C_3$ can be calculated using Equation (6). Again, if these steps result in values for first capacitance $C_1$, second capacitance $C_2$, and third capacitance $C_3$ that are within the permissible ranges for each device (i.e., $C_{k,min} \leq C_k \leq C_{k,max}$), then a perfect match is achieved for tuning the system.

Figure 4:
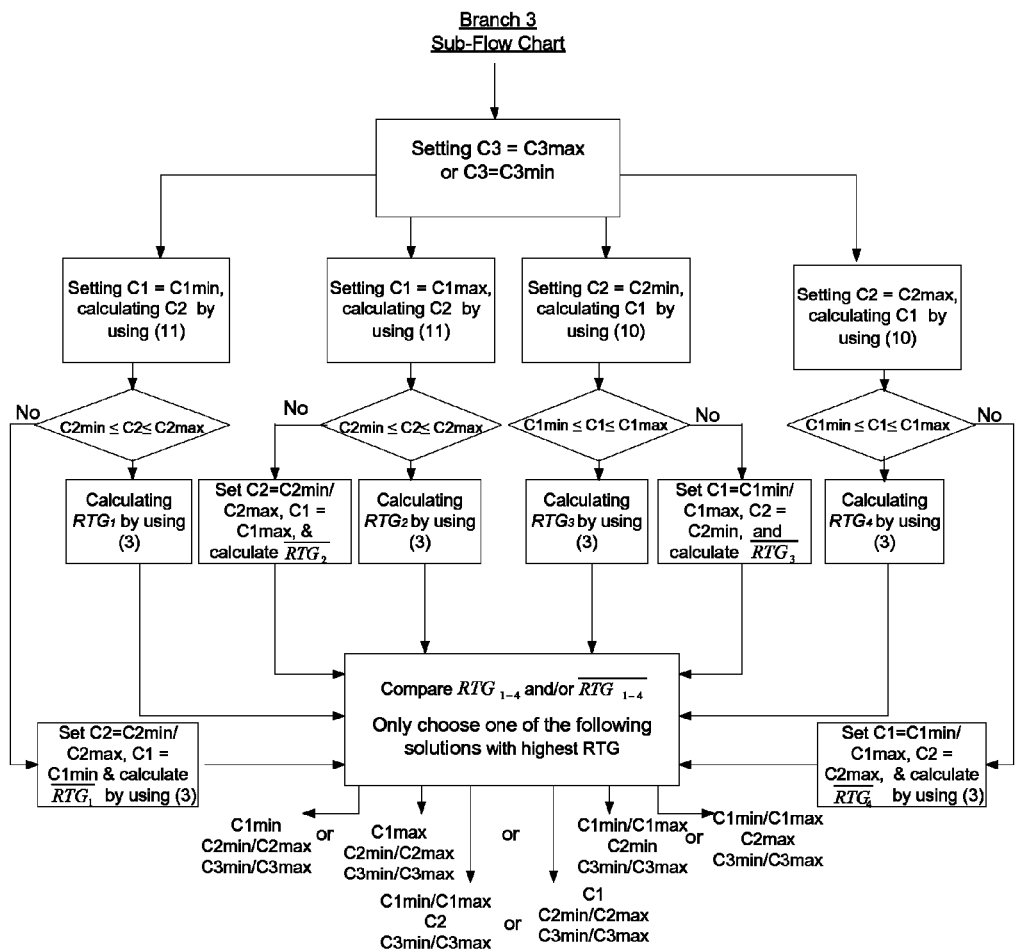
FIG. 4 is a flow chart illustrating a tuning method according to an embodiment of the presently disclosed subject matter.

Otherwise, if third capacitance $C_3$ is less than minimum third capacitance $C_{3,max}$, third capacitance $C_3$ can be set to be equal to minimum third capacitance $C_{3,max}$, and the steps outlined in the flow chart illustrated in FIG. 4 can be performed. Alternatively, if third capacitance $C_3$ is greater than maximum third capacitance $C_{3,max}$, third capacitance $C_3$ can be set to be equal to maximum third capacitance $C_{3,max}$ if third capacitance $C_3$ is less than or equal to $1/(\omega^2 L)$, or third capacitance $C_3$ can be set to be equal to minimum third capacitance $C_{3,max}$ if third capacitance $C_3$ is less than or equal to $1/(\omega^2 L)$. In either case, the method can further comprise the relevant steps outlined in the flow chart illustrated in FIG. 4, which is discussed hereinbelow.

If it is determined that a perfect tuning match cannot be achieved as discussed above, further tuning steps can be taken to achieve a match that is not perfect but is the best possible match for the given system parameters. Referring to FIG. 4, where first capacitance $C_1$ is set to minimum first capacitance $C_{1,min}$ or to maximum first capacitance $C_{1,max}$ and third capacitance $C_3$ is set to minimum third capacitance $C_{3,max}$ or maximum third capacitance $C_{3,max}$ for the reasons discussed above, second capacitance $C_2$ can be calculated using Equation (11). Alternatively, where second capacitance $C_2$ is set to be equal to minimum second capacitance $C_{2,min}$ or maximum second capacitance $C_{2,max}$ and third capacitance $C_3$ is set to minimum third capacitance $C_{3,min}$, or to maximum third capacitance $C_{3,max}$ for the reasons discussed above, first capacitance $C_1$ can be calculated using Equation (10) for the best match.

Once these values are determined, the best match tuning method can further involve searching for the maximum TG/RTG based on values of first capacitance $C_1$ and second capacitance $C_2$ calculated from Equations (10) and (11). The RTG is calculated by using calculations involving S parameters of the network tuner:

$$RTG = \frac{|S_{21}|^2}{|1 - S_{22}\Gamma_L|^2} \quad (12)$$

where $\Gamma_L$ is load reflection coefficient and $$S_{11} = \frac{-(\overline{Y_{C1}} + \overline{Y_{C2}}) + \lfloor 1 + (\overline{Y_{C2}} - \overline{Y_{C1}}) - \overline{Y_{C1}Y_{C2}}\rfloor \cdot \overline{Z_{Le}}}{2 + \overline{Y_{C1}} + \overline{Y_{C2}} + (1 + \overline{Y_{C1}} + \overline{Y_{C2}} + \overline{Y_{C1}Y_{C2}}) \cdot \overline{Z_{Le}}} \quad (13)$$

$$S_{21} = S_{12} = \frac{2}{2 + \overline{Y_{C1}} + \overline{Y_{C2}} + (1 + \overline{Y_{C1}} + \overline{Y_{C2}} + \overline{Y_{C1}Y_{C2}}) \cdot \overline{Z_{Le}}} \quad (14)$$

and $$S_{22} = \frac{-(\overline{Y_{C1}} + \overline{Y_{C2}}) + [1 - (\overline{Y_{C2}} - \overline{Y_{C1}}) - \overline{Y_{C1}Y_{C2}}] \cdot \overline{Z_{Le}}}{2 + \overline{Y_{C1}} + \overline{Y_{C2}} + (1 + \overline{Y_{C1}} + \overline{Y_{C2}} + \overline{Y_{C1}Y_{C2}}) \cdot \overline{Z_{Le}}} \quad (15)$$

where $$\overline{Z_{Le}} = \frac{Z_{Le}}{R_o}, \overline{Y_{C1}} = Y_{C1} \cdot R_o, \text{ and } \overline{Y_{C2}} = Y_{C2} \cdot R_o$$

$$Z_{Le} = 2\pi f \cdot L_e\left(\frac{1}{Q_{Le}(f)} + j\right) \quad (16)$$

$$Y_{C1} = 2\pi f \cdot C_1\left(\frac{1}{Q_{C1}(f)} + j\right) \quad (17)$$

and $$Y_{C2} = 2\pi f \cdot C_2\left(\frac{1}{Q_{C2}(f)} + j\right) \quad (18)$$

For the case where first capacitance $C_1$ is set to minimum first capacitance $C_{1,min}$, and second capacitance $C_2$ is within the range of $C_{2,min} \leq C_2 \leq C_{2,max}$, $RTG = \overline{RTG_1}$ can be calculated using Equation (12). If second capacitance $C_2$ is not within the range of $C_{2,min} \leq C_2 \leq C_{2,max}$, however, second capacitance $C_2$ can be set to minimum second capacitance $C_{2,min}$ or to maximum second capacitance $C_{2,max}$ if second capacitance $C_2$ is less than minimum second capacitance $C_{2,min}$ or greater than maximum second capacitance $C_{2,max}$, respectively, and $RTG = \overline{RTG_1}$ can be calculated using Equation (12).

For the case where first capacitance $C_1$ is set to maximum first capacitance $C_{1,max}$, and second capacitance $C_2$ is within the range of $C_{2,min} \leq C_2 \leq C_{2,max}$, $RTG = \overline{RTG_2}$ can be calculated using Equation (12). If second capacitance $C_2$ is not within the range of $C_{2,min} \leq C_2 \leq C_{2,max}$, however, second capacitance $C_2$ can be set to minimum second capacitance $C_{2,min}$ or to maximum second capacitance $C_{2,max}$ if second capacitance $C_2$ is less than minimum second capacitance $C_{2,min}$ or greater than maximum second capacitance $C_{2,max}$, respectively, and $RTG = \overline{RTG_2}$, can be calculated using Equation (12).

For the case where second capacitance $C_2$ is set to minimum second capacitance $C_{2,min}$, and first capacitance $C_1$ is within the range of $C_{1,min} \leq C_1 \leq C_{1,max}$, $RTG = \overline{RTG_3}$ can be calculated using Equation (12). If first capacitance $C_1$ is within the range of $C_{1,min} \leq C_1 \leq C_{1,max}$, however, first capacitance $C_1$ can be set to minimum first capacitance $C_{1,min}$ or to maximum first capacitance $C_{1,max}$ if first capacitance $C_1$ is less than minimum first capacitance $C_{1,min}$ or greater than maximum first capacitance $C_{1,max}$, respectively, and $RTG = \overline{RTG_3}$ can be computed using Equation (12).

For the case where second capacitance $C_2$ is set to maximum second capacitance $C_{2,max}$, and first capacitance $C_1$ is within the range of $C_{1,min} \leq C_1 \leq C_{1,max}$, $RTG = \overline{RTG_4}$ can be calculated using Equation (12). If first capacitance $C_1$ is within the range of $C_{1,min} \leq C_1 \leq C_{1,max}$, however, first capacitance $C_1$ can be set to minimum first capacitance $C_{1,min}$ or to maximum first capacitance $C_{1,max}$ if first capacitance $C_1$ is less than minimum first capacitance $C_{1,min}$ or greater than maximum first capacitance $C_{1,max}$, respectively, and $RTG = \overline{RTG_2}$ can be computed using Equation (12).

Comparing $RTG_1/\overline{RTG_1}$, $RTG_2/\overline{RTG_2}$, $RTG_3/\overline{RTG_3}$, and $RTG_4/\overline{RTG_4}$, the solutions or the setting of the tunable capacitors can be selected corresponding to the largest $RTG_X$ or $\overline{RTG_X}$ among the four RTG values calculated. The solutions can thus be one of the following permutations sets: $(C_{1,min}/C_{1,max}, C_2, C_{3,min}/C_{3,max})$ or $(C_1, C_{2,min}/C_{2,max}, C_{3,min}/C_{3,max})$ or $(C_{1,min}/C_{1,max}, C_{2,min}/C_{2,max}, C_{3,min}/C_{3,max})$, where it is understood that $C_x/C_y$ is read as $C_x$ or $C_y$. These are the best match solutions that maximize the RTG.

Capacitor-Bridged Double Pi Network Configuration

Although the above discussion involved tuning methods particularly designed for use with a Pi network 10, the tuning methods according to the present subject matter can be applied to other network configurations. Specifically, for example, for the capacitor-bridged double Pi network 20 shown in FIG. 1b, a similar method can be applied. Similar to Pi network 10 discussed above, capacitor-bridged double Pi network 20 can include a first tunable MEMS capacitor, generally designated 21, having a first capacitance $C_A$ and connected to first node 1, a second tunable MEMS capacitor, generally designated 22, having a second capacitance $C_B$ connected to second node 2, and a third tunable MEMS capacitor, generally designated 23, having a third capacitance $C_D$ and a first inductor, generally designated 34, having a first inductance $L_1$ connected in parallel between first node 1 and second node 2.

Figure 5:
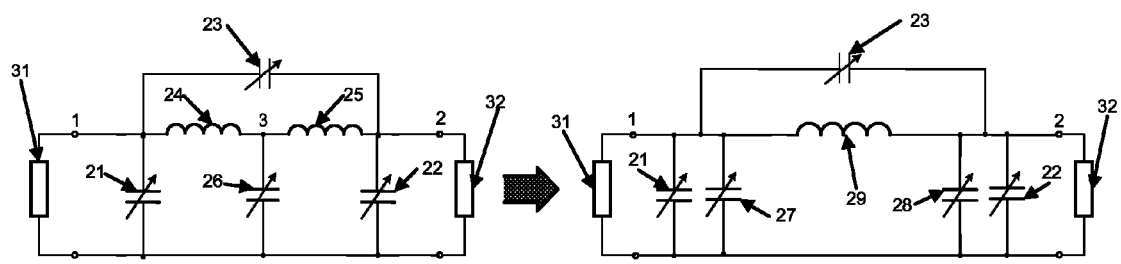
FIG. 5 is a circuit arrangement for a tunable capacitor-bridged double Pi matching network connected to a source and a load.
Figure 6:
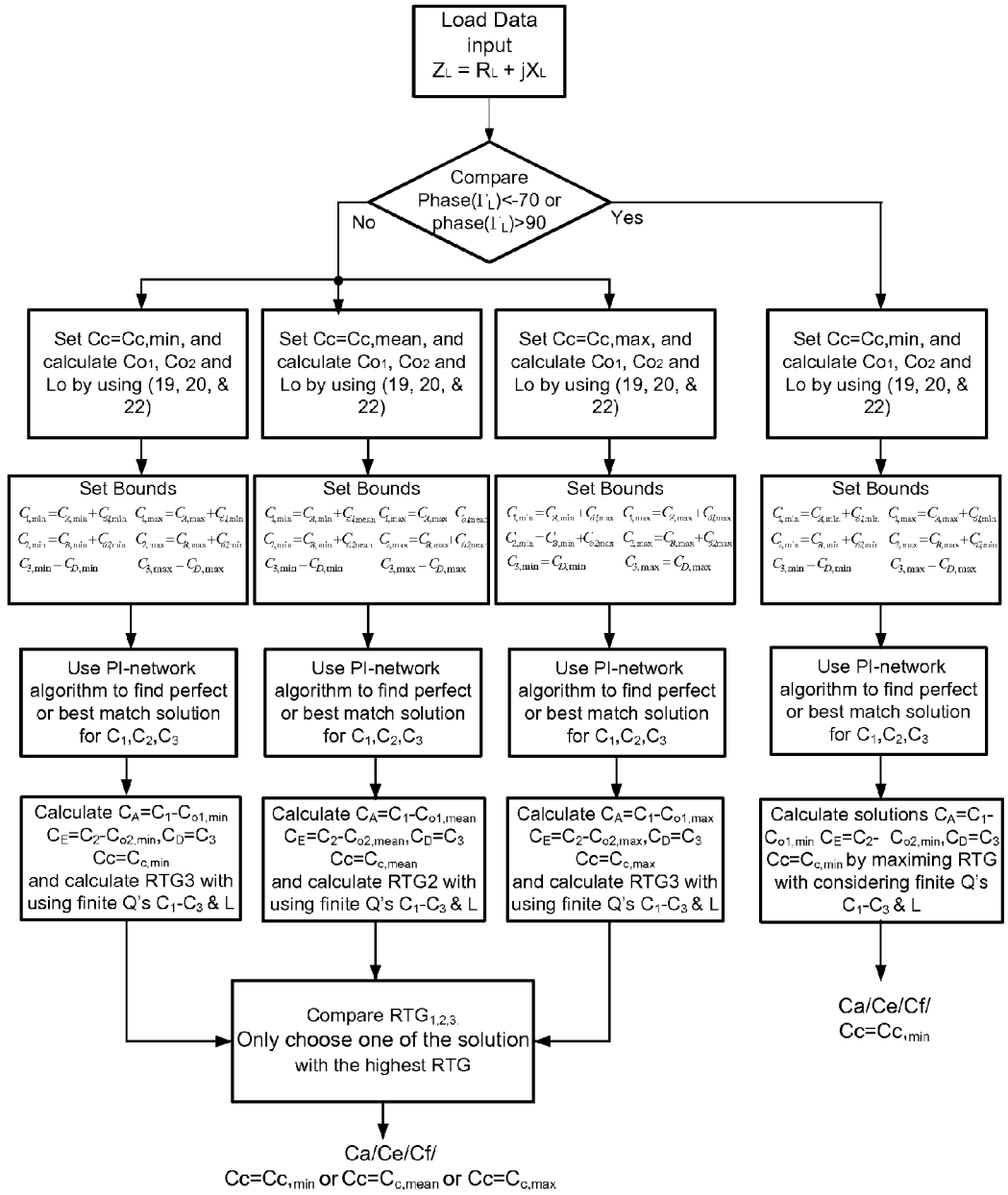
FIG. 6 is a flow chart illustrating a tuning method according to an embodiment of the presently disclosed subject matter.

This system can differ from Pi network 10 discussed above, however, in that it can have a second inductor, generally designated 25, having a second inductance $L_2$ arranged in series with first inductor 24 between first and second nodes 1 and 2 and a fourth variable capacitor, generally designated 26, defining a fourth capacitance $C_C$ connected to a third node 3 between first inductor 24 and second inductor 25. This system can be modeled as shown in FIG. 5 as a single Pi network, with fourth variable capacitor 26 being modeled as two separate elements, a first equivalent capacitor, generally designated 27, connected between first capacitor 21 and first inductor 24 and defining a first equivalent capacitance $C_{o1}$ and a second equivalent capacitor, generally designated 28, connected between second inductor 25 and second capacitor 22 and defining a second equivalent capacitance $C_{o2}$, and with first inductor 24 and second inductor 25 being treated as a single equivalent inductor, generally designated 29, defining an equivalent inductance $L_o$. In this way capacitor-bridged double Pi network 20 can be analyzed as if it were a single Pi network, thereby allowing for application of the equations identified above by utilizing the following formulas:

$$C_1 = C_A + C_{o1} = C_A + \frac{C_C}{1 + L_1/L_2 - \omega^2 L_1 C_C} \quad (19)$$

$$C_2 = C_B + C_{o2} = C_B + \frac{C_C}{1 + L_2/L_1 - \omega^2 L_2 C_C} \quad (20)$$

$$C_3 = C_D \quad (21)$$

and $$L_o = L_1 + L_2 - \omega^2 L_1 L_2 C_C \quad (22)$$

It should be recognized that these formulas differ from those established with respect to the configuration of Pi network 10 with the addition of fourth capacitance $C_C$. This means that the formulas developed for use with Pi network 10 and the tuning method described above can be applied equally to this configuration as long as the value for fourth capacitance $C_C$ is defined. It is noted, however, that the value for fourth capacitance $C_C$ in the tunable matching network optimal match tuning goes to either a minimum fourth capacitance $C_{C,min}$ or a maximum fourth capacitance $C_{C,max}$ at a probability of around 80% or more as discussed below. Based on a distribution of the value of fourth capacitance $C_C$ over a certain area of the Smith chart, such as $0.5 \leq |\Gamma_L| \leq 0.9$ at any angle, the tuning method can thus comprise the following steps.

In a first step, for a load reflection coefficient in the region of phase within $-\theta_1 \leq \angle \Gamma_L \leq +\theta_2$ (e.g., $-70° \leq \angle \Gamma_L \leq +90°$), and magnitude within $0.5 \leq |\Gamma_L| \leq 0.9$, fourth capacitance $C_C$ can be set to minimum fourth capacitance $C_{C,min}$, and values for first, second, and third capacitances $C_1$ through $C_3$ can be determined using Equations (19) through (21). The tuning method described above with reference to the flow chart shown in FIG. 3 can be followed to process match tuning calculations. In the RTG calculation of the Pi network tuning algorithm, all the components in the Pi network are related to the components in the tunable matching network by Equations (19) through (22), and values for each of the parameters of capacitor-bridged double Pi network 20 can be determined based on the following relationships (assuming a finite Q factor):

$$\hat{C}_A = C_A \left(1 - \frac{j}{Q_{CA}(f)}\right) \quad (22)$$

$$\hat{C}_C = C_C \left(1 - \frac{j}{Q_{CC}(f)}\right) \quad (23)$$

$$\hat{C}_E = C_E \left(1 - \frac{j}{Q_{CE}(f)}\right) \quad (24)$$

$$\hat{C}_F = C_F \left(1 - \frac{j}{Q_{CF}(f)}\right) \quad (25)$$

And $$\hat{L}_k = L_k \left(1 - \frac{j}{Q_{Lk}(f)}\right) \quad (26)$$

$k = 1$ and $2$

In a second step, for a load reflection coefficient in the region of phase within $+180° \leq \angle \Gamma_L \leq +180° - \theta_3$ (and within $-180° \leq \angle \Gamma_L \leq -180° + \theta_4$), and magnitude within $0.5 \leq |\Gamma_L| \leq 0.9$, the method can comprise the following steps. Fourth capacitance $C_C$ can be set to be equal to maximum fourth capacitance $C_{C,max}$, and values for first, second, and third capacitances $C_1$ through $C_3$ can be determined using Equations (19) through (21). The tuning method disclosed above with reference to the Pi network can be used to obtain the maximized $RTG_1$. Fourth capacitance $C_C$ can then be set to be equal to a value within the range of $C_{C,min} \leq C_C \leq C_{C,max}$ (e.g., $C_C = C_{C,mean}$), and values for first, second, and third capacitances $C_1$ through $C_3$ can be again be calculated. The tuning method for the Pi network can again be used to obtain the maximized $RTG_2$. Values for $RTG_1$ and $RTG_2$ can be compared, and the solution of capacitance values having the larger RIG value can be selected.

In a third step, for a load reflection coefficient having a phase within the rest of region $\angle \Gamma_L$ and a magnitude within $0.5 \leq |\Gamma_L| \leq 0.9$, the method can comprise the following steps. Fourth capacitance $C_C$ can be set to be equal to maximum fourth capacitance $C_{C,max}$, and values for first, second, and third capacitances $C_1$ through $C_3$ can be determined using Equations (19) through (21). The tuning method disclosed above with reference to the Pi network can be used to obtain the maximized $RTG_1$. Fourth capacitance $C_C$ can then be set to be equal to an average value between the boundary conditions of the fourth capacitor (i.e., $C_C = C_{C,mean}$), and values for first, second, and third capacitances $C_1$ through $C_3$ can again be calculated. The tuning method for the Pi network can again be used to obtain another maximized $RTG_2$. Fourth capacitance $C_C$ can be set to be equal to minimum fourth capacitance $C_{C,min}$, and values for first, second, and third capacitances $C_1$ through $C_3$ can be calculated. The tuning method for the Pi network can then be used to obtain a third maximized $RTG_3$. Values for $RTG_1$, $RTG_2$ and $RTG_3$, can be compared, and the solution of capacitance values having the larger RTG value can be selected.

Separating the calculations for load reflection coefficients within different phases can help to reduce the computation time but is not necessary. For example, optimal simulations across 700 MHz to 2700 MHz can show that in the middle section of $-180° \leq \angle \Gamma_L \leq -180°$, the value of fourth capacitance $C_c$ is generally always equivalent to minimum fourth capacitance $C_{c,min}$, and the value of fourth capacitance $C_c$ is equal to maximum fourth capacitance $C_{c,max}$ when the reflection coefficient angle is close to + or $-180°$. There is no a criterion for choosing the $\theta$s, so long as $\theta_i$ (i=1, 2, 3, or 4) is not too large.

In yet another alternative approach, the calculation of capacitance values for load reflection coefficients in the region of phase within $+180° \geq \angle \Gamma_L \geq +180° - \theta_3$ can be bypassed. In this case, the load reflection coefficient region for the third step can be for a phase within $+180° \geq \angle \Gamma_L \geq +$ $180°-\theta_2$, within $-180°\leq\angle\Gamma_L\leq-180°+\theta_1$, and having a magnitude within $0.5\leq|\Gamma_L|\leq0.9$. The third step can thus be used to determine the perfect or the best match solution of capacitance set $C_A$, $C_B$, $C_C$, & $C_D$ values with the largest RTG over the entire area of the load reflection coefficient defined in the Smith chart, for example for a phase within $-180°\leq\angle\Gamma_L\leq+180°$ and a magnitude within $0.5\leq|\Gamma_L|\leq0.9$. It is to be understood, however, that more computation time can be required if this calculation approach is used.

Tuning Applications

Figure 7A:
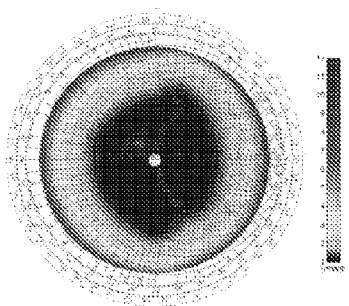
FIGS. 7a and 7b are graphs illustrating input voltage standing wave ratio contour plots for networks tuned using methods according to an embodiment of the presently disclosed subject matter.
Figure 7B:
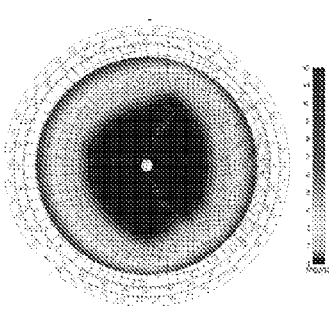
Figure 7C:
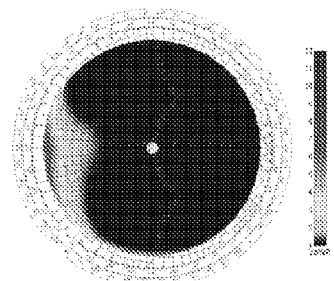
FIGS. 7c and 7d are graphs illustrating input voltage standing wave ratio contour plots for networks tuned using conventional simulation optimizer methods.
Figure 7D:
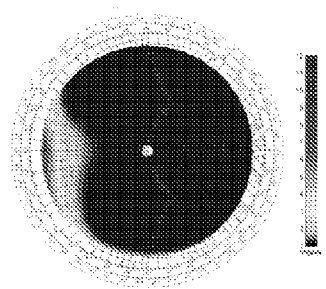

In one common configuration, a Pi network tuner (e.g., configuration shown in FIG. 1a) can have the following parameters: first and second tunable capacitors 11 and 12 having a tuning range from 0.8 pF to 5 pF, third tunable capacitor 13 possessing a tuning range from 0.25 pF to 4 pF, and first inductor 14 of 6.8 nH and 2.3 nH being used for low frequency band (e.g., 700 to 960 MHz) and for high frequency band (e.g., 1710 to 2170 MHz), respectively. The input VSWR contours of match tuning the load with reflection $|\Gamma_L|$ can vary from 0.05 to 0.95 at 700 MHz by using the tuning method disclosed above and utilizing the optimizer are shown in FIGS. 7a and 7c, respectively. The average VSWR over the Smith chart within the region of $0.05\leq\angle\Gamma_L\leq0.95$ and $-180°\leq\angle\Gamma_L\leq180°$ can be 2.15 and 2.13 for the algorithm and optimizer, respectively, and the difference can be only $\Delta=0.02$. The average VSWR over the Smith chart within the same region at 2170 MHz can be 1.212 and 1.209 resulting from the algorithm and the optimizer, respectively, as depicted in FIGS. 7b and 7d.

In the region of $|\Gamma_L|<0.5$, the input VSWR can be very close to 1:1. In most cellular handset applications, a VSWR less than 3:1 is usually required after match tuning. Therefore, the most interesting area in the Smith chart to check the tuner functioning is within the region of $0.55\leq|\Gamma_L|\leq0.90$ and $-180°\leq\angle\Gamma_L\leq180°$. Thus, the following discussion relates to the matching performance within this region. A comparison of the average input VSWR obtained from the optimizer and algorithm at different frequencies are given in Table 1.

TABLE 1

| Frequency (MHz) | Optimizer Average VSWR | Algorithm Average VSWR | ΔVSWR |
|---|---|---|---|
| 700 | 3.22 | 3.22 | 0.00 |
| 960 | 2.31 | 2.31 | 0.00 |
| 1710 | 1.22 | 1.23 | 0.01 |
| 2170 | 1.41 | 1.42 | 0.01 |

Figure 8A:
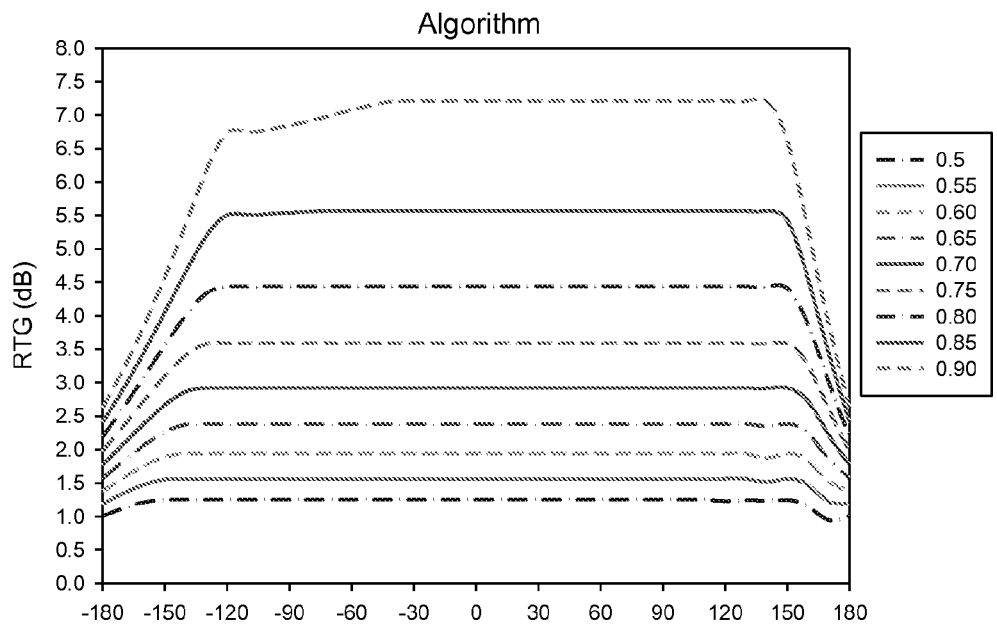
FIGS. 8a and 8b are graphs illustrating relative transducer gain results for load reflection coefficients of networks at 2170 MHz for the case of a lossless network using methods according to an embodiment of the presently disclosed subject matter and conventional simulation optimizer methods, respectively.

The plots of the RTG versus the load reflection coefficient (e.g., $0.5\leq|\Gamma_L|\leq0.9$ and $-180°\leq\angle\Gamma_L\leq180°$) at 2170 MHz derived from the tuning algorithm and the optimizer simulation are given in FIGS. 8a and 8c, respectively. The average RTG over the above area is found to be 3.19 dB for the algorithm and 3.20 dB for the optimizer and the difference is only 0.01 dB. A comparison of the average RTG resulting from the algorithm and the optimizer at different operating frequencies is presented in Table 2.

TABLE 2

| Frequency (MHz) | Optimizer Average RTG (dB) | Algorithm Average RTG (dB) | ΔRTG (dB) |
|---|---|---|---|
| 700 | 2.12 | 2.12 | 0.00 |
| 960 | 2.68 | 2.67 | -0.01 |
| 1710 | 3.31 | 3.30 | -0.01 |
| 2170 | 3.20 | 3.19 | -0.01 |

Figure 8B:
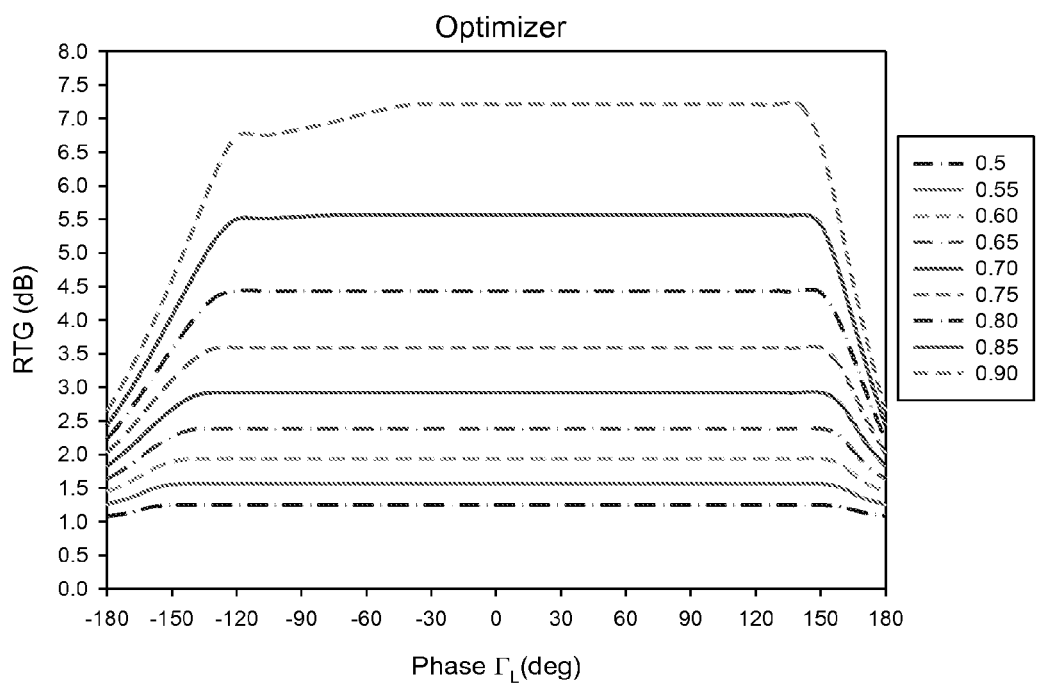
Figure 9A:
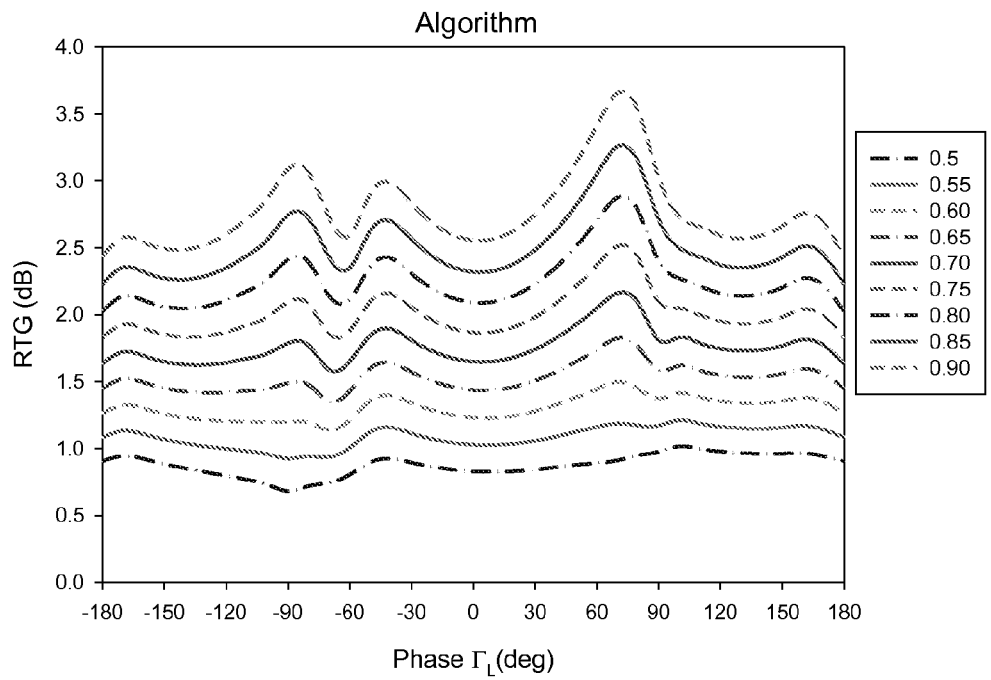
FIGS. 9a and 9b are graphs illustrating relative transducer gain results for load reflection coefficients of networks at 700 MHz using methods according to an embodiment of the presently disclosed subject matter and conventional simulation optimizer methods, respectively.
Figure 9B:
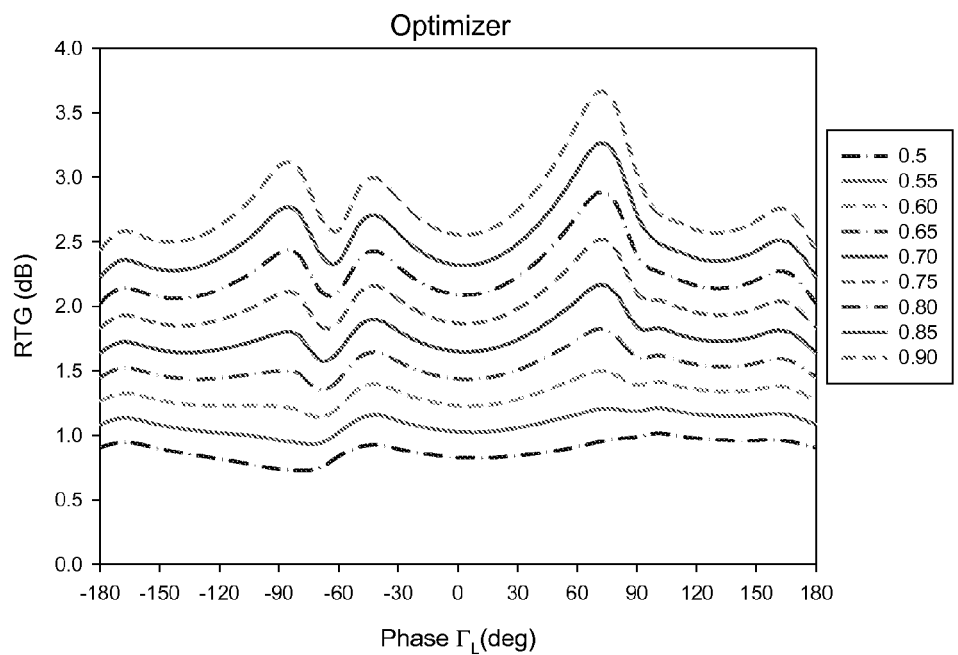

In the practical case, all the components of Pi network 10 can have a finite Q factor instead of infinite. Accordingly, the following provides a comparison of results achieved by the present tuning methods of a Pi network tuner with loss with those resulting from optimizer simulations. Assuming that the tuner is formed by the components with same tunable range and nominal value as defined in the previous example but having a finite Q factor, their quality factors are $Q_{C1,2}=100$ for first and second tunable capacitors 11 and 12, $Q_{C3}=150$ for third tunable capacitor 13 and $Q_L=55$ for first inductor 14. In order to take the finite Q of the components into account, the final RTG and/or input VSWR calculations can use Equations (16) through (18). In the case of the tuner with loss, the plots of the RTG versus the load reflection coefficient ($0.5\leq|\Gamma_L|\leq0.9$ and $-180°\leq\angle\Gamma_L\leq180°$) at 700 MHz derived from the tuning algorithm and the optimizer simulation are given in FIG. 8. The average RTG over the above area can be found to be about 1.79 dB and 1.78 dB for the optimizer and algorithm, respectively, and the difference can be only about 0.01 dB. A comparison of the average RTG resulting from the algorithm and the optimizer at different operating frequencies is presented in Table 3.

TABLE 3

| Frequency (MHz) | Optimizer Average RTG (dB) | Algorithm Average RTG (dB) | ΔRTG (dB) |
|---|---|---|---|
| 700 | 1.79 | 1.78 | -0.01 |
| 960 | 2.10 | 2.05 | -0.05 |
| 1710 | 2.29 | 2.22 | -0.07 |
| 2170 | 2.29 | 2.22 | -0.07 |

The tuning method for capacitor-bridged double Pi network 20 can also provide very accurate results compared with the results obtained from an MWO simulation optimizer. For example, capacitor-bridged double Pi network 20 shown in FIG. 1b can have first and second inductors 24 and 25 configured to have a combined inductance $L_o$ that is substantially equivalent to the inductance $L_1$ of first inductor 14 of Pi network 10 and having values of about 3.4 nH for 700-960 MHz, 1.5 nH for 1710-2170 MHz, and 1.0 nH for 2500-2700 MHz, first and second capacitors 21 and 22 having minimum capacitances $C_{a,min}$ and $C_{b,min}$ equal to about 1.5 pF (parasitics included) and maximum capacitances $C_{a,max}$ and $C_{b,max}$ equal to about 6 pF, third capacitor 23 having a minimum capacitance $C_{c,min}$ of about 0.6 pF and a maximum capacitance $C_{c,max}$ of about 4.0 pF, fourth capacitor 26 having minimum capacitance $C_{d,min}$ of about 0.4 pF and a maximum capacitance $C_{d,max}$ of about 4.0 pF, and quality factors of $Q_{ca}=Q_{cb}=100$, $Q_{cc}=Q_{cd}=150$, and $Q_L=55$.

Figure 10A:
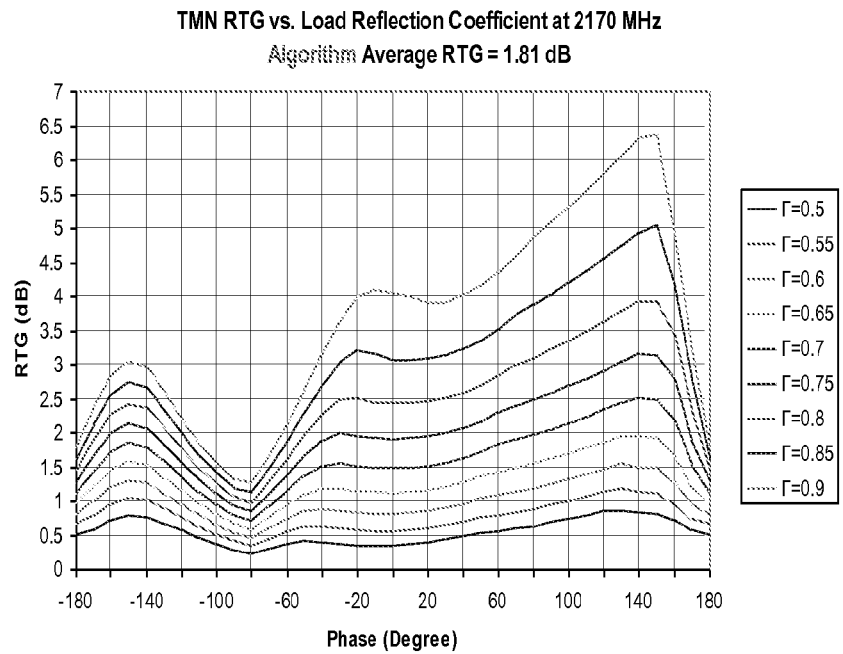
FIGS. 10a and 10b are graphs illustrating relative transducer gain versus load reflection coefficients using gain results for load reflection coefficients of networks at 700 MHz using methods according to an embodiment of the presently disclosed subject matter and conventional simulation optimizer methods, respectively.
Figure 10B:
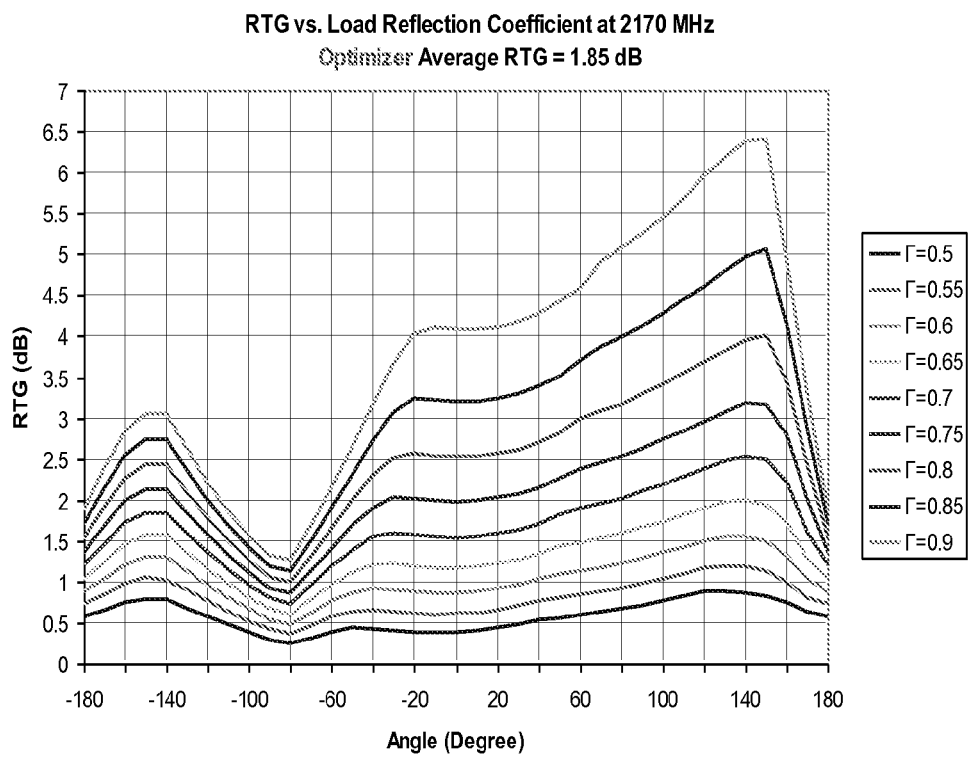

Plots of the RTG vs. load reflection coefficient at 2500 MHz resulting from the algorithm and the simulation optimizer are shown in FIG. 10. In this configuration, the difference of the average RTG obtained from the algorithm and the optimizer can be only about 0.05 dB. A comparison of the average RTG derived from the algorithm and the optimizer at other frequencies is presented in Table 4.

TABLE 4

| Frequency (MHz) | Optimizer Average RTG (dB) | Algorithm Average RTG (dB) | $\Delta RTG = RTG_{avg\_A} - RTG_{avg\_O}$ (dB) |
| --- | --- | --- | --- |
| 700 | 1.85 | 1.83 | −0.02 |
| 824 | 2.25 | 2.21 | −0.04 |
| 960 | 2.29 | 2.23 | −0.06 |
| 1710 | 2.22 | 2.16 | −0.06 |
| 1980 | 2.10 | 2.05 | −0.05 |
| 2170 | 1.85 | 1.81 | −0.04 |
| 2500 | 1.99 | 1.94 | −0.05 |
| 2700 | 1.80 | 1.76 | −0.04 |

Figure 11A:
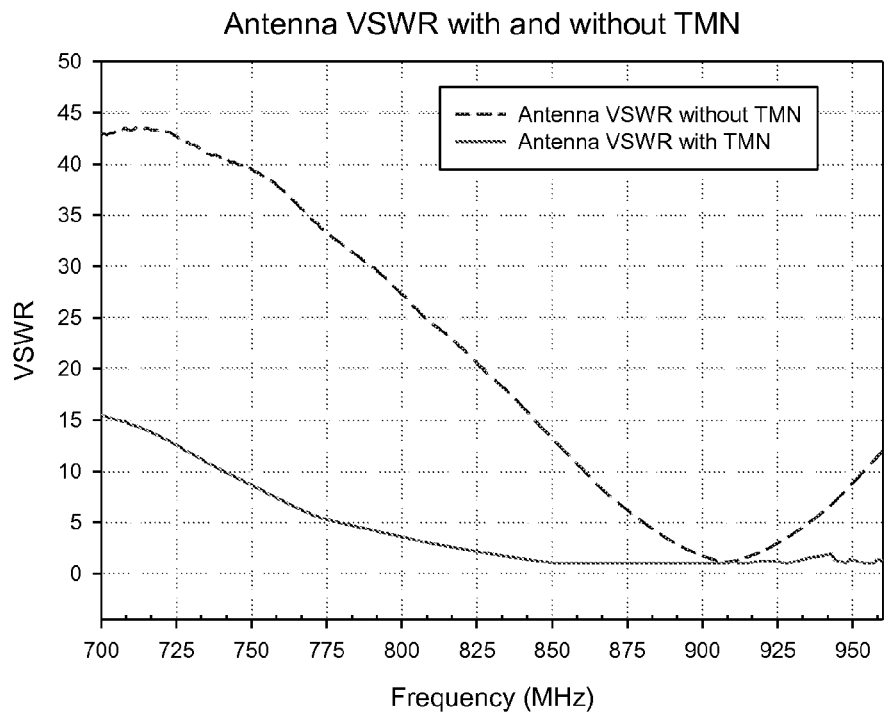
FIGS. 11a and 11b are graphs illustrating input voltage standing wave ratio improvement for a low frequency band and a high frequency band, respectively, after using methods according to an embodiment of the presently disclosed subject matter.
Figure 11B:
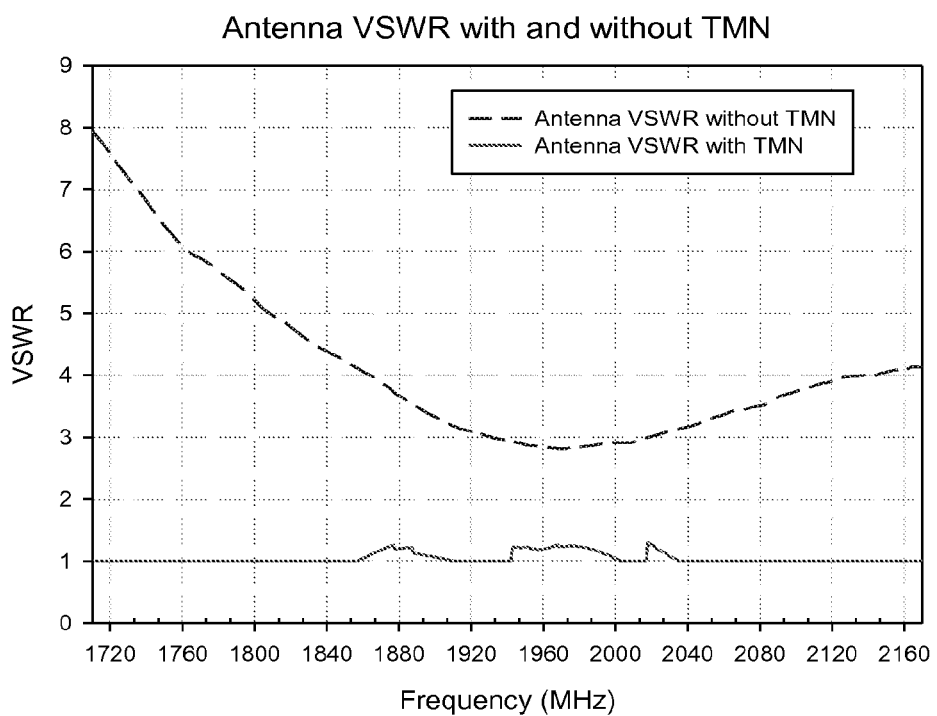

In order to demonstrate the performance of the capacitor-bridged double Pi tuning algorithm, an example for matching a handset antenna is adopted here. The reflection coefficient data measured for a particular handset antenna, for example, can be used in this study. The present method can be used to maximize the RTG for each frequency point in two different frequency bands: low band from 700 MHz to 960 MHz and high band from 1710 MHz to 2170 MHz. Exemplary data for the VSWR of the original antenna without TMN and the VSWR after using the TMN with maximizing RTG tuning for the low and high frequency bands are depicted in FIGS. 11a and 11b, respectively. From these two plots, it can be seen that the improvement of the input VSWR after using the TMN is clearly very significant if the tuning is performed at each frequency. It is noted that the antenna used in this example appears to have been designed for the ECell and PCS bands since in these two bands it has the lower VSWR. Therefore, its performance in 700 MHz band is very bad (e.g., the VSWR up to 43:1).

Figure 12A:
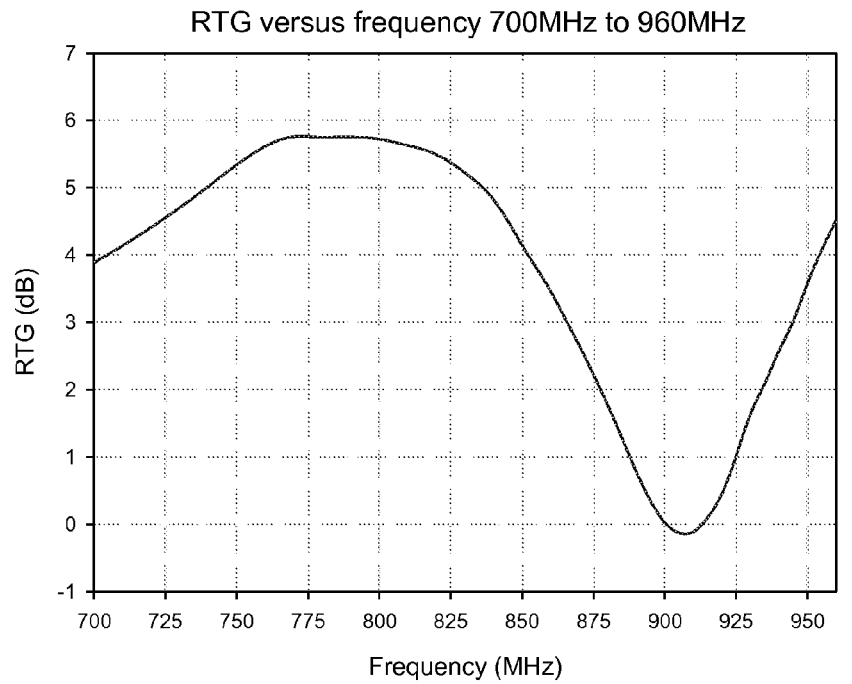
FIGS. 12a and 12b are graphs illustrating relative transducer gain versus frequency for a low frequency band and a high frequency band, respectively, after using methods according to an embodiment of the presently disclosed subject matter.
Figure 12B:
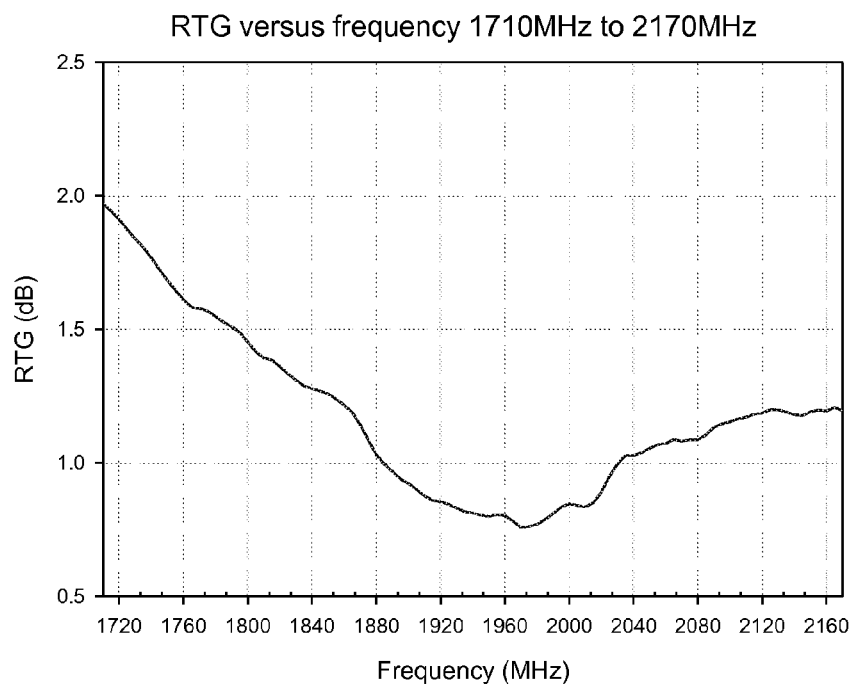

The RTG verses frequency resulting from the TMN algorithm tuning in the low and high bands is shown in FIGS. 12a and 12b, respectively. It is expected that large RTG can be obtained in the frequency region with high VSWR and small RTG where the VSWR is low. In fact, the RTG can also depend on where the load impedance locates in the Smith chart.

Accordingly, the tuning methods disclosed herein can do the same job with similar accuracy as the simulation optimizer, but the speed of these methods can be more than 1000 times faster than the speed of the optimizer.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A method for tuning a tunable matching network comprising a first variable capacitor comprising a terminal connected to a first node, a second variable capacitor comprising a terminal connected to a second node, and a first inductor and a third variable capacitor connected in parallel between the first and second nodes, the method comprising:

(a) comparing a source impedance of a source connected to the first node to a real part of a load impedance of a load connected to the second node;

(b) when the source impedance is greater than the real part of the load impedance or when a calculated capacitance of the second variable capacitor is less than a minimum capacitance:

(i) setting a capacitance value of the second variable capacitor to be a minimum capacitance of the second variable capacitor; and (ii) determining a capacitance value of the first variable capacitor based on a predetermined relationship between the capacitance of the first variable capacitor, a conductance of the source, and an equivalent conductance of the first inductor and the third variable capacitor;

(c) when the source impedance is less than the real part of the load impedance or when a calculated capacitance of the first variable capacitor is less than a minimum capacitance:

(i) setting a capacitance value of the first variable capacitor to be a minimum capacitance of the first variable capacitor; and (ii) determining a capacitance value of the second variable capacitor based on a predetermined relationship between the capacitance of the second variable capacitor, a minimum susceptance of the first variable capacitor, an impedance of the source, a conductance of the load, and a susceptance of the load;

(d) determining a capacitive value of the third variable capacitor based on a predetermined relationship between the capacitance of the third variable capacitor, an inductance of the first inductor, and an equivalent series inductance of the first inductor and the third variable capacitor;

(e) adjusting the capacitance value of one or more of the first variable capacitor, second variable capacitor, or third variable capacitor if the capacitance value is less than a minimum capacitance or greater than a maximum capacitance for the first variable capacitor, second variable capacitor, or third variable capacitor, respectively; and (f) setting the capacitances of the first variable capacitor, the second variable capacitor, and the third variable capacitor to be equal to the respective capacitance values.

2. The method of claim 1, wherein the predetermined relationship between the capacitance of the first variable capacitor, a conductance of the source, and an equivalent conductance of the first inductor and the third variable capacitor comprises the relationship:

$$C_1 = \frac{1}{2\pi f} \sqrt{G_o(G_e - G_o)}$$

where $C_1$ is the capacitance of the first variable capacitor, $G_o$ is the conductance of the source, and $G_e$ is the equivalent conductance of the first inductor and the third variable capacitor.

3. The method of claim 1, wherein the predetermined relationship between the capacitance of the second variable capacitor, a minimum susceptance of the first variable capacitor, an impedance of the source, a conductance of the load, and a susceptance of the load comprises the relationship:

$$C_2 = \frac{1}{2\pi f}\left(\sqrt{\frac{G_L}{R_o}(1 + R_o^2 B_{C1,min}^2) - G_L^2} - B_L\right)$$

where $C_2$ is the capacitance of the second variable capacitor, $B_{C1,min}$ is the minimum susceptance of the first variable capacitor, $R_0$ is the impedance of the source, $G_L$ is the conductance of the load, and $B_L$ is the susceptance of the load.

4. The method of claim 1, wherein the predetermined relationship between the capacitance of the third variable capacitor, an inductance of the first inductor, and an equivalent series inductance of the first inductor and the third variable capacitor comprises the relationship:

$$C_3 = \frac{L_e - L}{\omega^2 L_e L}$$

where $C_3$ is the capacitance of the third variable capacitor, L is the inductance of the first inductor, and $L_e$ is the equivalent series inductance of the first inductor and the third variable capacitor.

5. The method of claim 1, wherein the tunable matching network further comprises a second inductor arranged in series with the first inductor between the first and second nodes and a fourth variable capacitor comprising a terminal connected to a third node between the first inductor and the second inductor; and wherein the method further comprises:

(g) when a reflection coefficient of the load is within a chosen region of phase:
(i) setting a capacitance value of the fourth variable capacitor to be a minimum capacitance of the fourth variable capacitor;
(ii) determining capacitance values of the first, second, and third variable capacitors according to steps (a) through (e); and
(iii) setting the capacitances of the first variable capacitor, the second variable capacitor, the third variable capacitor, and the fourth variable capacitor to be equal to respective capacitance values; and (h) when a reflection coefficient of the load is outside the chose region of phase:
(i) setting a capacitance value of the fourth variable capacitor to be a maximum capacitance of the fourth variable capacitor, determining capacitance values of the first, second, and third variable capacitors according to steps (a) through (e), and determining a first maximum relative transducer gain value based on the capacitance values;
(ii) setting a capacitance value of the fourth variable capacitor to be a predetermined capacitance between a maximum capacitance and a minimum capacitance of the fourth variable capacitor, determining capacitance values of the first, second, and third variable capacitors according to steps (a) through (e), and determining a second maximum relative transducer gain value based on the capacitance values;
(iii) setting a capacitance value of the fourth variable capacitor to be a minimum capacitance of the fourth variable capacitor, determining capacitance values of the first, second, and third variable capacitors according to steps (a) through (e), and determining a third maximum relative transducer gain value based on the capacitance values; and
(iv) setting the capacitances of the first variable capacitor, the second variable capacitor, the third variable capacitor, and the fourth variable capacitor to be equal to respective capacitance values corresponding to a highest of the first, second, or third maximum relative transducer gain values.

6. The method of claim 1, wherein adjusting the capacitance value of one or more of the first variable capacitor, second variable capacitor, or third variable capacitor comprises setting the capacitance value of the first variable capacitor, second variable capacitor, or third variable capacitor, respectively, to be equal to the minimum capacitance if the capacitance value determined is less than the minimum capacitance or to be equal to the maximum capacitance if the capacitance value determined is greater than the maximum capacitance.

7. The method of claim 6, wherein if the capacitance values of both the second variable capacitor and the third variable capacitor are equal to either the minimum capacitance or the maximum capacitance of the second variable capacitor and the third variable capacitor, respectively, adjusting the capacitance value of one or more of the first variable capacitor, second variable capacitor, or third variable capacitor further comprises determining a new capacitance value of the first variable capacitor based on a predetermined relationship between the capacitance of the first variable capacitor, a conductance of the load, a susceptance of the load, a susceptance of the second variable capacitor, and an equivalent series reactance of the first inductor and the third variable capacitor.

8. The method of claim 6, wherein if the capacitance values of both the first variable capacitor and the third variable capacitor are equal to either the minimum capacitance or the maximum capacitance of the first variable capacitor and the third variable capacitor, respectively, adjusting the capacitance value of one or more of the first variable capacitor, second variable capacitor, or third variable capacitor further comprises determining a new capacitance value of the second variable capacitor based on a predetermined relationship between the capacitance of the second variable capacitor, an impedance of the source, a susceptance of the load, a susceptance of the first variable capacitor, and an equivalent series reactance of the first inductor and the third variable capacitor.

9. The method of claim 8, wherein the predetermined relationship between the capacitance of the second variable capacitor, an impedance of the source, a susceptance of the load, a susceptance of the first variable capacitor, and an equivalent series reactance of the first inductor and the third variable capacitor comprises the relationship:

$$C_2 = \frac{1}{2\pi f} \cdot \frac{X_{Le}[1 - X_{Le}B_L(1 + R_o^2 B_{C1x}^2) + B_{C1x}R_o^2(2B_L + B_{C1x})] - R_o^2(B_L + B_{C1x})}{X_{Le}^2 + R_o^2(1 - X_{Le}B_{C1x})^2}$$

where $C_2$ is the capacitance of the second variable capacitor, $R_0$ is the impedance of the source, $B_L$ is the susceptance of the load, $B_{C1x}$ is the susceptance of the first variable capacitor, and $X_{Le}$ is the equivalent series reactance of the first inductor and the third variable capacitor.

10. The method of claim 7, wherein the predetermined relationship between the capacitance of the first variable capacitor, a conductance of the load, a susceptance of the load, a susceptance of the second variable capacitor, and an equivalent series reactance of the first inductor and the third variable capacitor comprises the relationship:

$$C_1 = \frac{1}{2\pi f} \cdot \frac{X_{Le}[(B_L + B_{C2x})^2 + G_L^2] - (B_L + B_{C2x})}{[1 - X_{Le}(B_L + B_{C2x})]^2 + X_{Le}^2 G_L^2}$$

where $C_1$ is the capacitance of the first variable capacitor, $G_L$ is the conductance of the load, $B_L$ is the susceptance of the load, $B_{C2x}$ is the susceptance of the second variable capacitor, and $X_{Le}$ is the equivalent series reactance of the first inductor and the third variable capacitor.

* * * * *